United States Patent [19]

Evans, Jr. et al.

[11] 4,335,503

[45] Jun. 22, 1982

[54] METHOD OF MAKING A HIGH VOLTAGE V-GROOVE SOLAR CELL

[75] Inventors: John C. Evans, Jr., Ravenna; An-Ti Chai, N. Ridgeville; Chandra P. Goradia, Cleveland, all of Ohio

[73] Assignee: The United States of America as represented by the Administrator of the National Aeronautics and Space Administration, Washington, D.C.

[21] Appl. No.: 219,678

[22] Filed: Dec. 24, 1980

[51] Int. Cl.³ .............................................. H01L 31/18
[52] U.S. Cl. ..................................... 29/572; 136/249; 148/1.5; 357/30
[58] Field of Search ......................... 29/572, 589, 591; 148/1.5; 136/249 MS; 357/30

[56] References Cited

U.S. PATENT DOCUMENTS 4,200,472  4/1980  Chappell et al. ..................... 136/246

FOREIGN PATENT DOCUMENTS 55-3660  1/1980  Japan ........................... 136/249 MS Primary Examiner—Aaron Weisstuch
Attorney, Agent, or Firm—Norman T. Musial; John R. Manning; Gene E. Shook

[57] ABSTRACT

A method is provided for making a high voltage multijunction solar cell which comprises a plurality of discrete voltage generating regions, or unit cells, which are formed in a single semiconductor wafer (10) and are connected together so that the voltages of the individual cells are additive. The unit cells comprise doped regions of opposite conductivity types (30, 32) separated by a gap. The method includes forming V-shaped grooves (16) in the wafer and thereafter orienting the wafer so that ions of one conductivity type can be implanted in one face (e.g., 16a) of the groove while the other face (e.g., 16b) is shielded. A metallization layer (22) is applied and selectively etched away to provide connections between the unit cells.

7 Claims, 9 Drawing Figures p+ ION FLUX n+ ION FLUX

METHOD OF MAKING A HIGH VOLTAGE V-GROOVE SOLAR CELL

ORIGIN OF THE INVENTION

The invention described herein was made by employees of the U.S. Government and may be manufactured and used by or for the Government for governmental purposes without the payment of any royalties thereon or therefor.

TECHNICAL FIELD

The present invention relates to an improved method for making a high voltage solar cell.

BACKGROUND ART

In our concurrently filed copending application Ser. No. 219,677, which is entitled "Planar Multijunction Solar Cells", and the subject matter of which is hereby incorporated by reference, there is disclosed a new type of solar cell exhibiting a high output voltage. In brief, the solar cell in question comprises a multiplicity of voltage generating regions within a single semiconductor wafer, each of the regions forming a unit cell within the wafer and the unit cells being connected together in series so that the contributions of all of the cells are added together. Although the solar cell disclosed in the abovementioned application is obviously not limited to such a method, a specific exemplary method for making the planar multijunction cell disclosed in that application provides for the creation of the voltage generating regions in a flat surface of the planar wafer by implantation or diffusion of active and passive materials to form p+, metal, and n+ regions within the flat surface. The implanting of metal creates certain problems and the method of the present invention eliminates such implanting of metal and thus offers substantial advantages as compared with the technique discussed above.

Reference is made to the patents and other materials cited in the abovementioned application for a discussion of other prior art techniques of possible interest.

SUMMARY OF THE INVENTION

In accordance with the invention, a method is provided for making a high voltage multijunction solar cell of the type discussed above, i.e., a solar cell wherein a plurality of discrete voltage generating regions or unit cells are formed within a single semiconductor body or wafer and are connected together so the voltage outputs of the individual unit cells are additive. As noted hereinbefore, the method of the invention eliminates metal implantation into the semiconductor body and thus possesses significant advantages over fabrication methods which require such metal implantation.

According to the method of the invention, grooves are formed in the surface of a semiconductor body, the grooves having first and second faces arranged at an angle to one another. An ion flux is used to implant ions of a first conductivity type into the first faces of the grooves so as to form doped regions of this first conductivity type therein while the semiconductor body is oriented such that substantially none of the ions are implanted into the second faces of the grooves. In other words, doped regions of a first conductivity type, e.g, n+ or p+, are selectively implanted in one face of the grooves. In the next step, doped regions of the opposite conductivity type are selectively formed in the second or other faces of the grooves, the semiconductor body being oriented during this step so that the first faces are protected and thus no ions of the opposite conductivity type are implanted therein. Thereafter metallization is provided in the grooves over the doped regions so as to connect the doped regions together. The metallization in an individual groove serves to connect together two adjacent unit cells of which the two doped regions of the groove individually form part, a unit cell being formed by one doped region of one groove and an oppositely doped region of a second, adjacent groove and the two regions being separated by a gap therebetween. This gap can comprise an undiffused portion of the semiconductor body between the two grooves which separates the two regions.

The grooves are preferably V-shaped and in a specific exemplary embodiment, the angle between the faces of a groove is 90° and the body is oriented at 45° and 135°, respectively, during the two implantation steps.

The metallization is preferably applied as a layer which covers one entire surface of the semiconductor body and selected portions of the layer are removed thereafter to provide the metallization between the grooves as well as contacts or terminals at the edges of the cell to enable the cell to be connected to an external circuit. A photoresist masking step followed by an etching step is preferably used both in forming the grooves as well as removing the unwanted portions of the metallization layer. The semiconductor body is preferably coated with a metal oxide layer and all or substantially all of this layer is also removed with the removal of the unwanted metal.

Other features and advantages of the invention will be set forth in, or apparent from, the detailed description of the preferred embodiments which follows.

DETAILED DESCRIPTION

Referring to FIGS. 1(a) to 1(f), there is illustrated the basic steps of forming the high voltage V-groove p-i-n solar cell of the invention. It will be appreciated that while a basic nine step process will be described, variations and modifications can be effected in these steps within the scope and spirit of the invention.

Figure 1A:
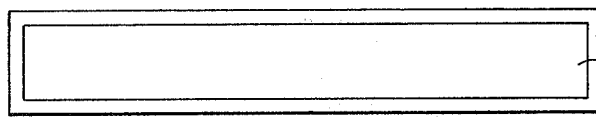
FIGS. 1(a) to 1(g) illustrates sequential steps utilized in carrying out a preferred embodiment of the method of the invention.

In the first step, referring to FIG. 1(a), a semiconductor wafer 10, such as a single crystal of silicon, is thermally oxidized or otherwise coated with a dielectric or insulating protective layer denoted 12. In an exemplary embodiment, wafer 10 has a thickness of about one hundred micrometers or 4 mils.

Figure 1B:
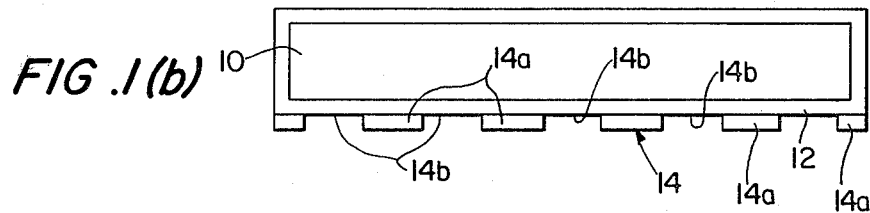

In the second step, which is partially illustrated in FIG. 1(b), the wafer is coated on one surface with a photoresist material indicated generally at 14, the material 14 is exposed through a pattern mask to ultraviolet light, the exposed pattern is developed and the unpolymerized photoresist material is dissolved away, leaving parallel strip-like regions of photoresist material, denoted 14a, on the surface of wafer to enable controlled silicon etching in the unprotected areas denoted 14b.

Figure 1C:
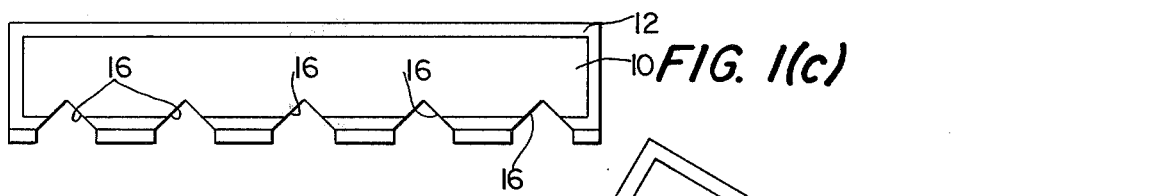

In the third step, illustrated in FIG. 1(c), V-shaped grooves 16 are etched in the unprotected areas 14b through the oxide layer 12 into the silicon wafer 10. In specific exemplary embodiment, the etching gap, i.e., the width of areas 14b, is approximately 70 micrometers wide and the depth of the etch is approximately ten micrometers from the oxide surface 12. The faces 16a and 16b of each groove 16 form an angle of approximately 90° and the spacing between grooves 16 is approximately 25 micrometers or 1 mil. Standard silicon etchants such as mixtures of hydrofluoric, nitric and acetic acids may be used in carrying out the etching step in accordance with conventional practice.

Figure 1D:
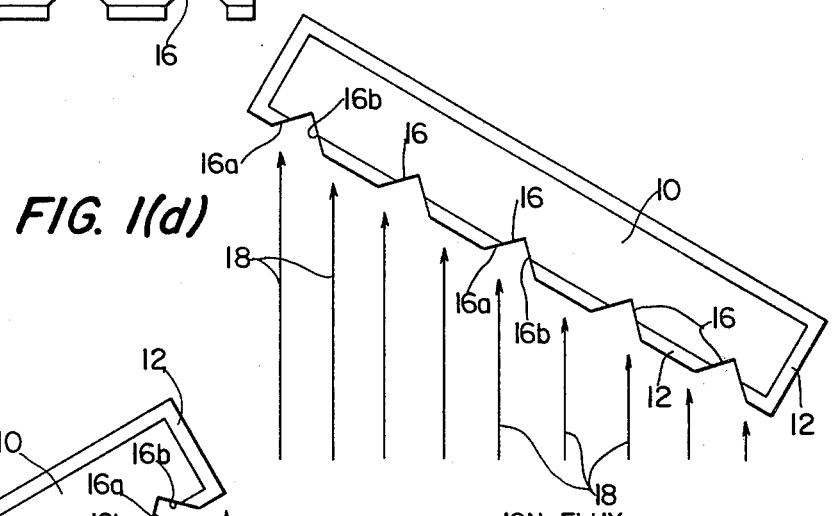

In step four, illustrated in FIG. 1(d), p+ ions, e.g., boron ions, are implanted along one wall or face of each V-groove 16 by appropriately orienting the surface of the silicon wafer 10 in relation to the direction of the incident ions. As illustrated, the wafer 10 is oriented at an angle of about 45° so that the lines of p+ ion flux, indicated at 18, are approximately perpendicular to one set of the faces of the V-grooves, viz., faces 16a. The opposite walls or faces 16b of grooves 16 lie parallel to the direction of the ion beams 18 and thus the p+ ions are not incident upon these surfaces.

Figure 1E:
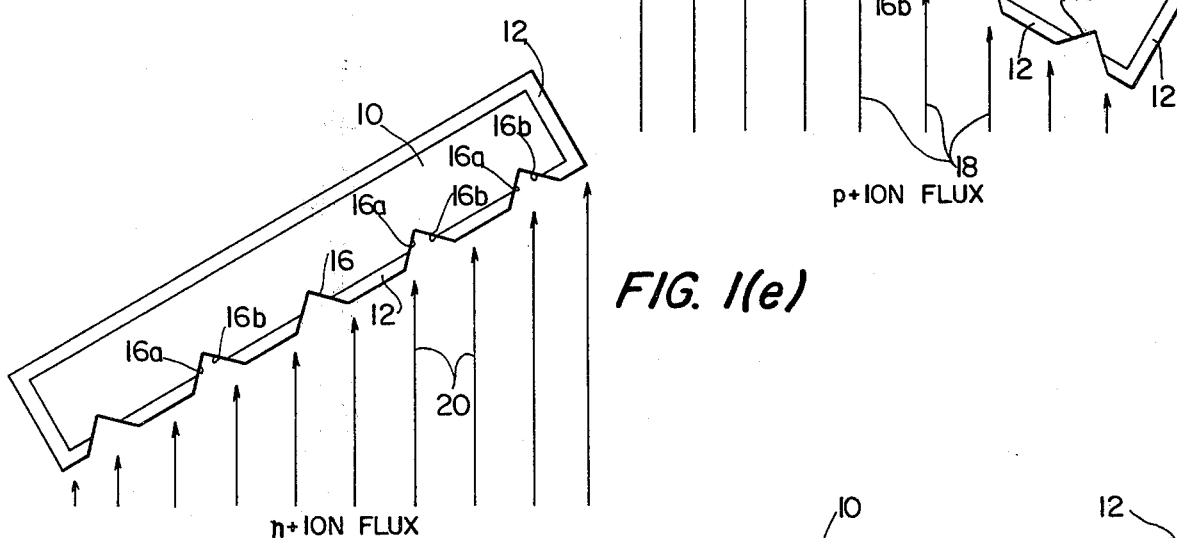

In the fifth step, illustrated in FIG. 1(e), the wafer 10 is again oriented at 45° but at an angle of 90° to the position for the fourth step. In this position, the other faces or walls 16b of grooves 16 are implanted with n+ ions, e.g., phosphorous ions. In this step, the faces 16b which receive the n+ ions are perpendicular to the n+ ion beam, indicated at 20, and the p+ doped faces 16a lie parallel to the beam and hence are shielded.

Figure 1F:
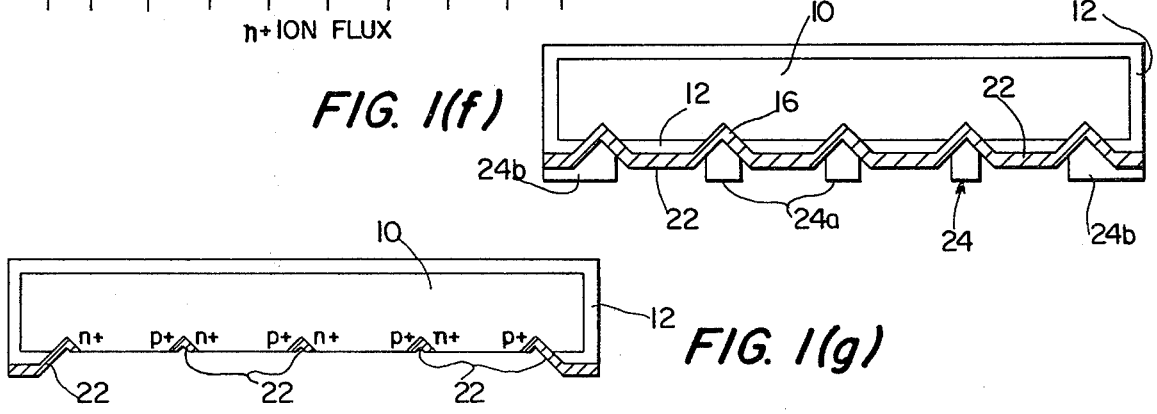

In the sixth step, the entire grooved wafer surface is coated with a metal layer 22, as illustrated in FIG. 1(f). In a specific embodiment this surface is coated with vacuum deposited or sputtered aluminum to a thickness of several micrometers.

In the seventh step, which is also illustrated in FIG. 1(f), photoresist material, generally denoted 24, is selectively applied in the grooves and over the ends of the wafer face. The photoresist material is dried, exposed through a suitable mask, and developed and thereafter the unpolymerized material is removed to leave protective strips 24a over the metallization layer 22 and protective strips 24b at the opposite edges of wafer 20.

Figure 1G:
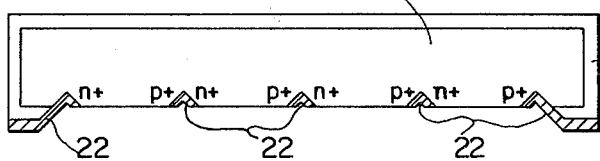

In the eighth step, illustrated in FIG. 1(g), the areas which are not protected by strips 24a, 24b are etched so as to remove all of the underlying metallization layer 22 and to remove the underlying oxide layer 12 to a depth closely approaching the silicon of wafer 10. Stated differently, a portion of the oxide layer 12 may be retained (and this has advantages) but all of the metal must be removed to prevent shorting out of the unit voltage-generating regions. The resist plastic strips 24a, 24b are then removed.

In the ninth and final step, the outermost grooves and connection tabs are "tinned" with solder to provide terminals for connection to the external circuit.

Figure 2:
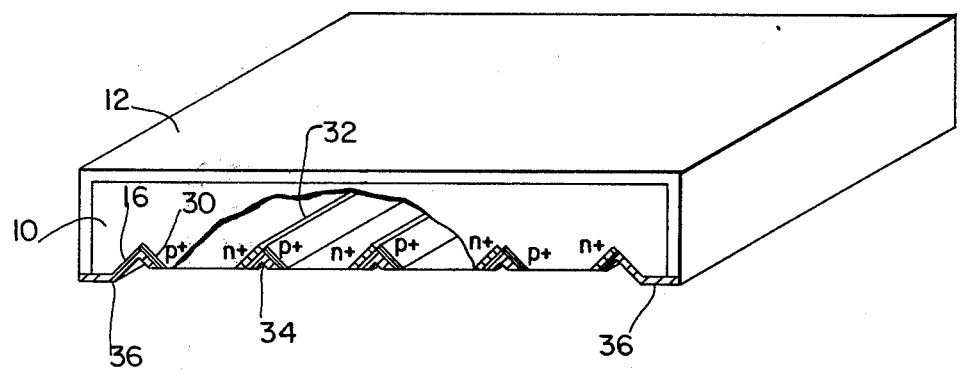
FIG. 2 is a perspective view of solar cell device constructed in accordance with the method of the invention.

Referring to FIG. 2, a perspective view of the finished solar cell is shown, a portion of the cell being cut away to show details of the V-shape groove. As illustrated, p+ regions 30 are formed in one face of each of the grooves 16 while n+ regions 32 are formed to the other face of each groove. The portions of metallization layer 22 remaining in the grooves 16 after the etching step are denoted 34 and provide a series connection between the p+ and n+ doped regions 30, 32. The "tinned" metal tabs or terminals are indicated at 36.

Figure 3:
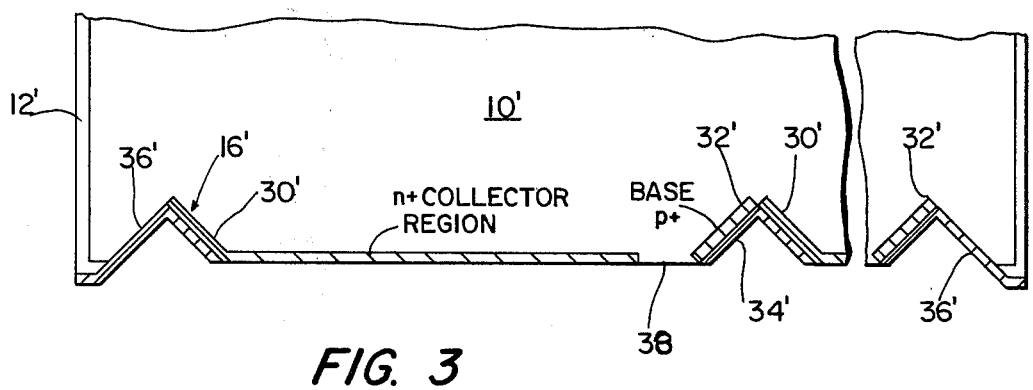
FIG. 3 is an end view, partially broken away, of a further embodiment of a solar cell constructed in accordance with the method of the invention.

Referring to FIG. 3, there is shown a detail of a portion of a further embodiment of a solar cell constructed which is generally in accordance with the method set forth above but which is modified with respect to the n+ collector region. The embodiment of FIG. 3 is similar to that shown in FIG. 2 and like elements have been given the same reference numerals, with primes attached. A unit cell or voltage generating region is formed by a pair of doped regions 30' and 32' separated by a gap region 38 of unimplanted semiconductor material. The p+ region 32' of one unit cell is connected to the n+ region 30' of an adjacent cell by metallization 34'. In the embodiment of FIG. 3, in contrast to that of FIG. 2, the n+ collector region 30' extends along a substantial portion of the surface of wafer 10'. In a preferred embodiment, an approximate ratio of 1 to 8 is provided for the length of the p+ doped base region 32' of groove 16 relative to the length of the n+ doped collector region 30'. The length of the gap region 38 is about 25 micrometers in an exemplary embodiment where the bulk doping is p-type silicon, although it will be appreciated that, as provided for in the concurrently filed copending application referred to above, other semiconductors, and other dimensions, can obviously be used.

Although the invention has been described in relation to exemplary embodiments thereof, it will be understood by those skilled in the art that variations and modifications can be effected in these exemplary embodiments without departing from the scope and spirit of the invention.

We claim:

1. A method of making a solar cell of the type comprising a plurality of discreet voltage generating regions formed within a single semiconductor body of one conductivity type having oppositely disposed surfaces said voltage generating regions being connected together so that their output voltages are additive; said method comprising:

forming a plurality of V-shaped grooves in one of said surfaces of said semiconductor body, each of said grooves being short of and spaced from the oppositely disposed surface and including first and second faces arranged in an angle of about 90° to one another;

orienting said semiconductor body to a first position wherein said second faces are substantially parallel to a first ion flux thereby implanting ions of a first conductivity type into the said first faces of said grooves so as to form a doped region of said first conductivity type therein while said body is oriented in said first position so that substantially none of said ions from said first ion flux are implanted in said second faces of said groove; and orienting said semiconductor body to a second position wherein said first faces are substantially parallel to a second ion flux thereby implanting ions of an opposite conductivity type into the said second faces of said grooves so as to form a doped region of the opposite conductivity type therein with said body oriented in said second position so that substantially none of said ions from said second ion flux are implanted in the said first faces of said grooves;

pairs of oppositely disposed doped regions of adjacent grooves in said semiconductor body being spaced apart by gaps comprising unimplanted regions of semiconductor material located between the adjacent grooves, said pairs of oppositely doped regions forming voltage generating unit cells and said method further comprising providing metallization in said grooves to connect together adjacent ones of said unit cells.

2. A method as claimed in claim 1 wherein said semiconductor body is oriented at 45° and 135° to said ion flux during said ion implanting steps.

3. A method as claimed in claim 1 wherein said grooves are formed using a photoresist masking step wherein the locations of said grooves on said planar surface are exposed for etching to produce said grooves.

4. A method as claimed in claim 1 wherein said metallization is applied as a layer of metallization over the surface of said semiconductor body and portions of the layer removed thereafter to provide said metallization in said grooves and to provide terminals at the edges of the body.

5. A method as claimed in claim 4 wherein said portions of said layer are removed using a photoresist masking step and an etching step.

6. A method as claimed in claim 1 wherein said semiconductor body is initially covered with an oxide.

7. A method as claimed in claim 6 wherein said metallization is applied as a layer, unprotected portions of said layer being removed thereafter using an etching step while protected portions are left to form said metallization in said grooves, said etching step removing at least a major portion of said oxide layer and all of the metal in the area of said unprotected portions.

* * * * *